(12) United States Patent
Masalkar

(10) Patent No.: US 6,441,373 B1
(45) Date of Patent: *Aug. 27, 2002

(54) INFRARED PHOTODETECTOR AND METHOD OF MANUFACTURING THE SAME

(75) Inventor: Prafulla Masalkar, Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/394,671

(22) Filed: Sep. 13, 1999

(30) Foreign Application Priority Data

Sep. 14, 1998 (JP) .......................... 10-260663

(51) Int. Cl.$^7$ ................................ G02B 6/34
(52) U.S. Cl. ................... 250/338.1; 250/338.4
(58) Field of Search .......... 250/338.1, 338.4, 250/370.01, 370.14, 370.08; 385/37

(56) References Cited

U.S. PATENT DOCUMENTS

| | | | |
|---|---|---|---|
| 4,743,083 A | * | 5/1988 | Schimpe ............... 350/96.19 |
| 5,229,614 A | | 7/1993 | Andersson et al. |
| 5,272,356 A | | 12/1993 | Wen et al. |
| 5,485,015 A | | 1/1996 | Choi |
| 5,506,419 A | | 4/1996 | Levine et al. |
| 5,539,206 A | | 7/1996 | Schimert |
| 5,773,831 A | * | 6/1998 | Brouns ............... 250/370.08 |

OTHER PUBLICATIONS

B.F. Levine, J. Appl. Phys. 74 (8), pp.R1–R81, Oct. 15, 1993.
J. Y. Andersson et al.; J. Appl. Phys. 71 (7), pp. 3600–3610, Apr. 1, 1992.
G. Sarusi et al.; Appl. Phys. Lett. 64 (8), pp. 960–962, Feb. 21, 1994.
S. D. Gunapala et al.; IEEE Trans. Electron Devices, vol. 44, No. 1, pp. 45–50, Jan. 1, 1997.
S. D. Gunapala et al.; IEEE Trans. Electron Devices, vol. 44, No. 1, pp. 51–57, Jan. 1, 1997.
S. Bandara et al.; SPIE, vol. 2999, pp. 103–109, 1997.
R. Petit et al.; Topics in Current Physics, vol. 22, Springer–Verlag, 1980.
W. J. Li et al.; J. Appl. Phys 71 (2), pp. 1038–1040; Jan. 15, 1992.
G. Hasnain et al.; Appl. Phys. Lett. 54 (25), pp. 2515–2517; Jun. 19, 1989.

* cited by examiner

Primary Examiner—Constantine Hannaher
Assistant Examiner—Otilia Gabor
(74) Attorney, Agent, or Firm—Armstrong, Westerman & Hattori, LLP

(57) ABSTRACT

An infrared photodetector comprising of a photoabsorption layer formed on a substrate comprising of a multiquantum well structure, and a diffraction pattern formed over the photoabsorption layer. The diffraction pattern has recesses whose planar shape contains curves. Accordingly, the infrared photodetector can be formed by the fewer patterning steps and can detect the infrared radiation efficiently.

11 Claims, 14 Drawing Sheets

Light

INFRARED PHOTODETECTOR AND METHOD OF MANUFACTURING THE SAME

BACKGROUND OF THE INVENTION

1. Field of the Invention

The present invention relates to an infrared photodetector and a method of manufacturing the same and, more particularly, an infrared photodetector which has a multiquantum-well structure forming a focal plane array and a method of manufacturing the same.

2. Description of the Prior Art

Quantum-well infrared photodetectors (QWIP) based focal plane arrays (FPA) are used for infrared imaging in 8 to 12 µm wavelength range. Such multiquantum well (MQW) infrared photodetector is described in B. F. Levine, J. Appl. Phys. 74(8), Oct. 15, 1993, for example.

The quantum-well infrared photodetectors consist of a gallium arsenide (GaAs) substrate with epitaxially grown MQW structure of alternate layers of AlGaAs and GaAs. The MQW layers are lithographically patterned into mesas to form separate elements or pixels. An example of infrared photodetector having such MQW layers, is shown in FIGS. 1A and 1B.

A structure having an MQW layer 2 is formed on a GaAs substrate 1, the MQW layer 2 is partitioned by recesses 3 formed by the lithography, and semiconductor circuits (not shown) formed in a silicon substrate 9 are connected to partitioned portions. Thus, each area partitioned by the recesses 3 is a pixel PX.

Infrared radiation is incident from the back of the GaAs substrate 1. Incident radiation only has components Ey and Ex that are parallel with the surface of the GaAs substrate 1. A sectional structure of one pixel area of the infrared photodetector is shown in FIG. 2, for example.

In FIG. 2, an n-type layer 1a formed of GaAs, an MQW layer 2, and an n-type layer 3 formed of GaAs are formed sequentially on an n-type GaAs substrate 1. A diffraction grating 4 is then formed on an upper surface of the n-type layer 3. And, the diffraction grating 4 contacts a silicon substrate 9 via a bump 5 formed of indium. In this case, in FIG. 2, reference 6 denotes a recess which partitions neighboring pixels.

Radiation entering each pixel through the GaAs substrate 1 is detected by photo-induced electron transition caused in the MQW layer 2. The light received by one pixel of the infrared photodetector is converted into an electric current and then output to an electronic circuit (not shown) formed on the silicon substrate 9.

However, the MQW layer 2 absorbs only the radiation that has an electric field component perpendicular to the epitaxial plane. This means that for normally incident radiation to be absorbed, its direction needs to be changed within a detector's pixel.

For changing direction of incident radiation, a diffraction grating etched on the top of the pixels as schematically shown in FIG. 2 is commonly used. The radiation diffracted from the grating 4 is confined to the pixel by total internal reflection.

Different schemes to facilitate absorption of the light, i.e., optical coupling, in QWIP were reviewed by the above mentioned article by Levine.

Progress began from simple method of MQW illumination through a substrate edge polished at 45° angle used in the early work.

Coupling efficiency was initially improved by planar metallic strip gratings, which could diffract light at angles close to 90°.

Later, etched one-dimensional and two-dimensional periodic gratings with an internally reflecting layer on substrate further improved the efficiency to about four times that of 45° coupling geometry, respectively.

As the two-dimensional periodic grating, as shown in FIG. 3A, there is a periodic grating 4. As shown in FIGS. 3B and 3C, one concave portion 4b is formed in the middle of one unit 4a by etching. A plurality of units 4a is formed in a matrix fashion, as shown in FIG. 3A.

In J. Appl. Phys. 71(7), Apr. 1, 1992, pp.3600–3610, Anderson et al. carried out detailed theoretical analysis and experimentally achieved, for 8–10 µm long wavelength range, an efficiency of about 2–3 times that of 45° coupling geometry. However, as shown in FIG. 3C, the periodic grating with internally reflecting layer 3 could produce only two passes through the MQW layer 2.

In Appl. Phys. Lett. 64(1994), pp.960–962, Sarusi et al. showed that increasing the number of passes through the MQW layer by employing a pseudo-random grating can achieve efficiencies about 14 times that of 45° coupling. Experimentally, efficiency about eight times that of 45° coupling was demonstrated for peak response wavelength 16.4 µm. In their experiment light confinement to a pixel was achieved by thinning GaAs substrate.

The pseudo-random grating 4 has the structure which contains three stepped surfaces 4c, 4d, 4e each having a different height, as shown in FIGS. 4A to 4C, for example, and is formed by the two etched steps patterned. Optimized size for its unit cell was about 5.7 µm and a smallest feature width was 1.25 µm.

Later, Gunpala et al., in IEEE Trans. Electron Devices, 44 (1997), pp.45–50, used a pseudo-random grating for a QWIP device with 15 µm wavelength. Also, in the article in IEEE Trans. Electron Devices, 44(1997), pp.51–57, Gunpala et al. used a pseudo-random grating for a QWIP device with 8.5 µm wavelength. However, they could achieve only very low responsivity, e.g., at 8.5 µm wavelength, the responsivity was 0.3 A/W and at 14 µm wavelength, the responsivity was 0.4 A/W. This responsivity is slightly lower than twice that due to 45° coupling. At the 8.5 µm wavelength, optimized pseudo-random grating has unit cell of width of 2.9 µm and smallest feature width of 0.4 µm which is difficult to fabricate accurately.

Therefore, it has been thought that at 8.5 µm wavelength, it is essential to use a periodic grating that has a smallest feature size larger than the pseudo-random grating mentioned above. These result in lowing the diffraction efficiency.

As mentioned above, the optical coupling scheme that has demonstrated highest optical coupling efficiency in QWIP uses a pseudo-random grating. However, the coupling scheme is difficult to implement at shorter wavelengths. Coupling scheme using crossed periodic gratings which normally result in lower coupling efficiency than that with pseudo-random grating is thought to be suitable for peak wavelengths around 8.5 µm. An earlier scheme used angled surface on the pixel top combined with the reflection grating, the planar metallic gratings, the saw-tooth gratings, etc.

At any rate, if two-dimensional periodic diffraction grating shown in FIGS. 3A to 3C is employed, the high optical coupling capability as achieved in the pseudo-random gratings shown in FIG. 2 and FIGS. 4A to 4C cannot be attained since the light is reflected by the periodic grating by an angle of 90° relative to the substrate surface (not shown) at the time of second diffraction.

However, if the pseudo-random grating employed for the 8.5 μm wavelength is constructed by using the structure shown in FIGS. 4A to 4C, the number of steps is increased since two-step lithography is required, as described above. In addition, because the width of the lowest step area is small like about 0.4 μm, it is difficult to pattern the width with high precision and it is difficult to align the patterns in the two-step lithography.

If the patterning precision is degraded, the optical coupling in the multiquantum-well infrared photodetector is lowered.

SUMMARY OF THE INVENTION

It is an object of the present invention to provide an infrared photodetector having a new diffraction pattern and a method of manufacturing the same.

The above subjects can be covered by providing an infrared photodetector comprising of a photoabsorption layer formed on a substrate having a multiquantum-well structure; and a diffraction pattern formed on the photoabsorption layer to have recesses, planar shape of each of which contains curved shapes and sectional shape of each of which has a single step shape.

Also, the above subjects can be overcome by providing a method of manufacturing an infrared photodetector comprising the steps of forming a photoabsorption layer having a quantum-well structure on a substrate; forming a light transmitting layer on the photoabsorption layer; forming a mask, on which patterns having curved shapes are formed, on the light transmitting layer; forming a diffraction pattern on the light transmitting layer by etching the light transmitting layer in areas which are not covered with the mask; and removing the mask.

According to the present invention, the diffraction pattern whose planar shape includes curves (e.g., elliptic curves) is formed on the photoabsorption layer of the multiquantum-well structure.

It has been checked that the optical coupling rate of the infrared rays of the wavelength of 8.5 μm can be enhanced by such diffraction pattern. Besides, because the recesses constituting the diffraction pattern have a sectional shape like a single step, such recesses can be formed by a single lithography step and thus the fabrication steps can be reduced. Moreover, the minimum width of the diffraction pattern is about 0.6 μm and thus pattern fabrication is easier.

DESCRIPTION OF THE PREFERRED EMBODIMENT

An embodiment of the present invention will be explained in detail with reference to the accompanying drawings hereinafter.

Design process of the optical coupling grating of the multiquantum-well infrared photodetector (QWIP) is carried out by using the diffraction theory, based on calculation of the diffracted field in the pixels. The inventors of the present invention have theoretically found diffraction patterns which can achieve high coupling coefficient and can be employed for short wavelength such as a wavelength of 8.5 µm.

Steps of forming the diffraction pattern of a QWIP of the present invention will be explained hereinafter.

Figure 5A:
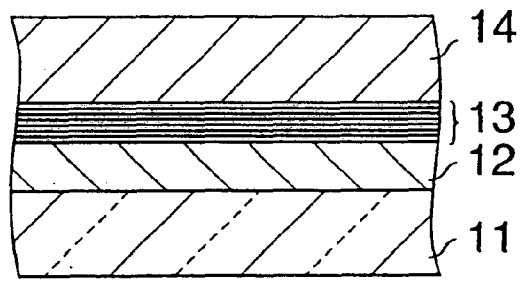
FIGS. 5A to 5D are sectional views showing steps of manufacturing an infrared photodetector according to an embodiment of the present invention.

First, as shown in FIG. 5A, semiconductor layers are formed to constitute the multiquantum-well infrared photodetector (QWIP). More particularly, a first n-type GaAs layer 12 of 1 µm thickness, an MQW layer 13, a second n-type GaAs layer 14 of 2 µm thickness are formed on an n-type GaAs substrate 11. The MQW layer 13 is formed by stacking gallium arsenide (GaAs) and aluminum gallium arsenide (AlGaAs), or gallium arsenide (GaAs) and indium gallium arsenide (InGaAs), or their combination alternatively as a plurality of layers.

Layer growth from the first n-type GaAs layer 12 to the second n-type GaAs layer 14 is conducted by the MOVPE method, the MBE method, or the like, for example.

Figure 5B:
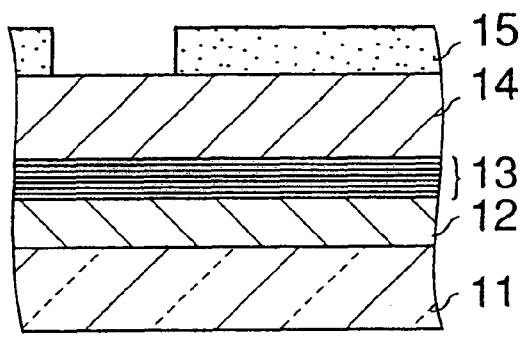
Figure 6A:
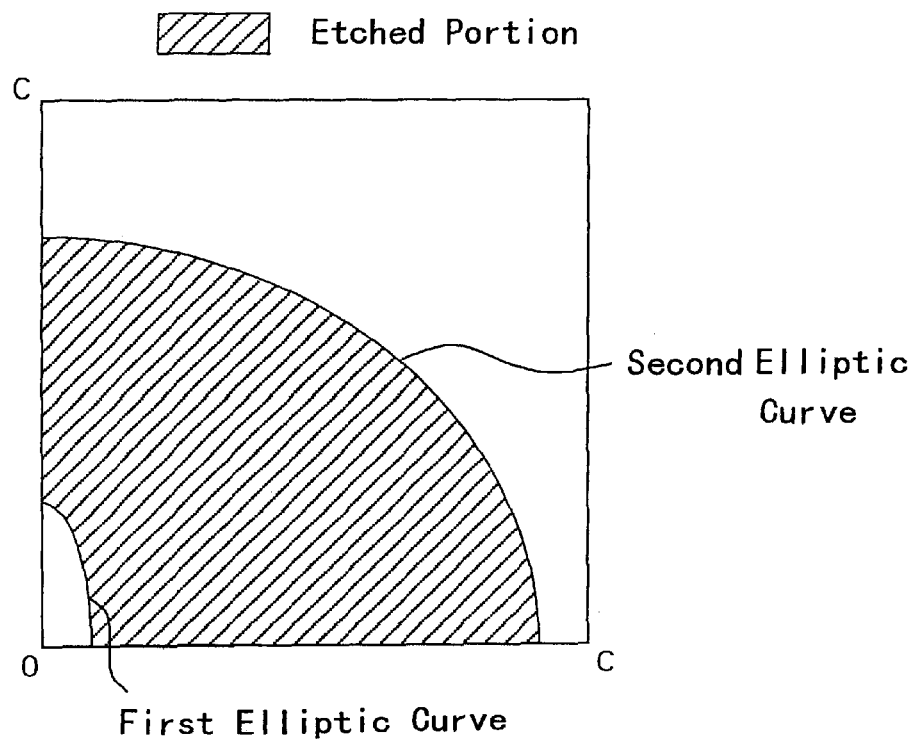
FIG. 6A is a plan view showing a basic pattern constituting a diffraction pattern according to an embodiment of the present invention.

Then, as shown in FIG. 5B, resist is coated on the second n-type GaAs layer 14 and then a resist pattern 15 is formed by exposing/developing the resist. The resist pattern 15 is a diffraction pattern containing curves. For example, as shown in FIG. 6A, the diffraction pattern has an opening which is derived by dividing a pattern which contains a first elliptical curve smaller than a second elliptical curve inside the second elliptic curve into four patterns. The first elliptic curve and the second elliptic curve are displaced by 90° mutually. As an example, by combining the basic patterns shown in FIG. 6A together, a diffraction pattern having a planar shape as shown in FIG. 7A, is formed.

Figure 5C:
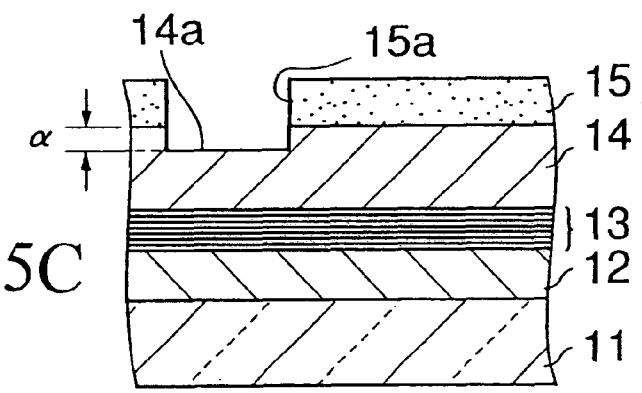

After the above resist pattern 15 has been formed, as shown in FIG. 5C, a recess 14a whose planar shape contains a part of the elliptic curve and whose sectional shape has a single step is formed on an upper surface of the second n-type GaAs layer 14 by etching an area of the second n-type GaAs layer 14, which is not covered with the resist pattern 15. A diffraction pattern 14a with a sectional shape shown in FIG. 7B appears on the upper surface of the second n-type GaAs layer 14 by transferring the pattern shown in FIG. 6B or FIG. 7A onto the second n-type GaAs layer 14. An etching depth α of the second n-type GaAs layer 14 is set equivalent to less than or equal to ½ of a wavelength λ'p at which exhibits strongest absorption in the MQW layer 13, for example.

Figure 7A:
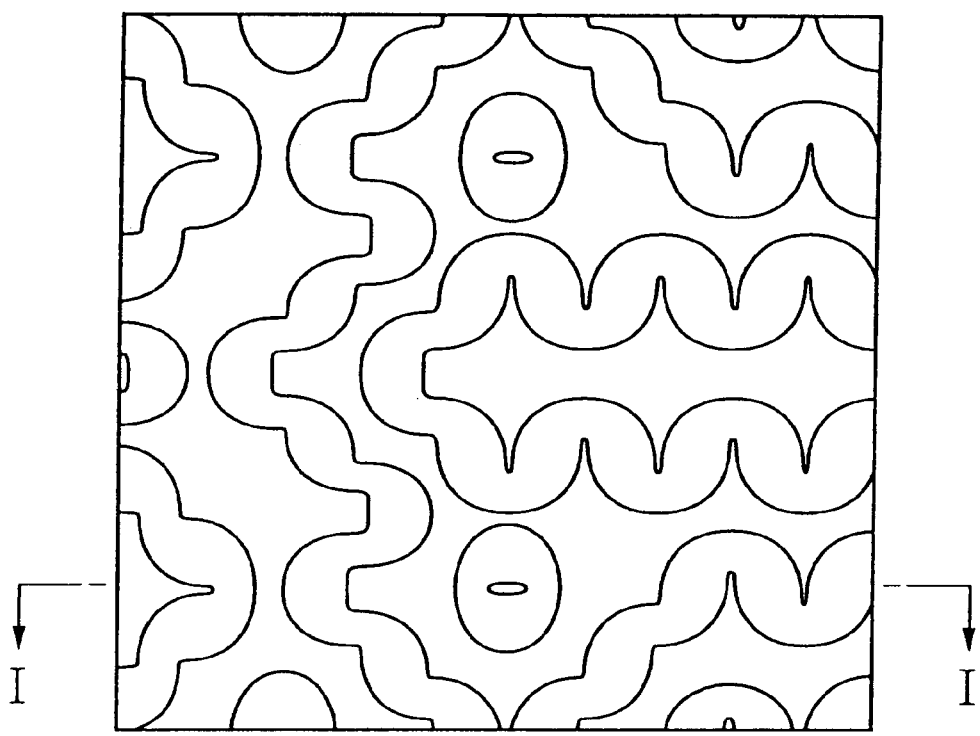
FIG. 7A is a plan view showing a first example of a diffraction pattern according to an embodiment of the present invention.

The quarter elliptic pattern shown in FIG. 7A is connected to the etching area. A total area of the etched portion is set substantially equal to a total area of the non-etched portion.

In this manner, after the recesses 14a each having elliptic curves are formed on the upper surface of the second n-type GaAs layer 14, the resist pattern 15 is removed by a solvent. As a result, the new diffraction pattern that has the recesses 14a is formed on the upper surface of the second n-type GaAs layer 14.

Figure 5D:
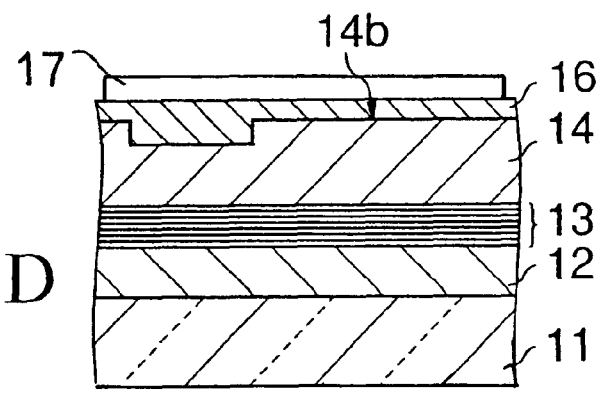

In turn, as shown in FIG. 5D, a reflection film 16 formed of conductive material such as gold, silver, aluminum, etc., which has a high reflectance, is formed in the concave portions 14a and on the second n-type GaAs layer 14 by sputtering or vacuum evaporation. The reflection film 16 formed of such conductive material is employed as a cathode.

Then, the cathode 16 is patterned by the lithography method, and a bump 17 made of indium (In) is formed on the cathode 16, and then the bump 17 is connected to a semiconductor integrated circuit formed on a silicon substrate (not shown). Thus, a basic structure of the infrared photodetector is completed.

Figure 1A:
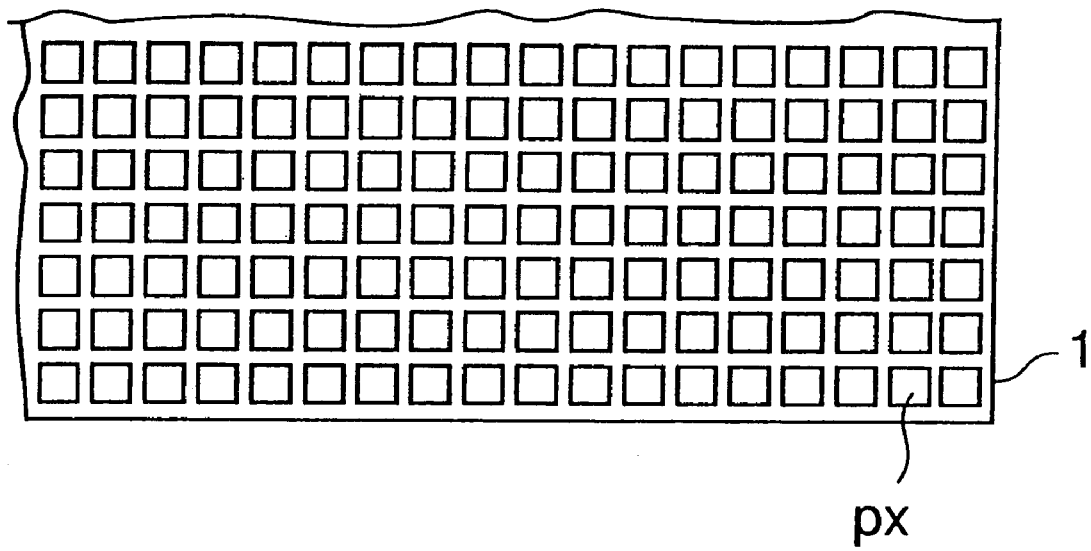
FIG. 1A is a plan view showing an infrared photodetector in the prior art.
Figure 1B:
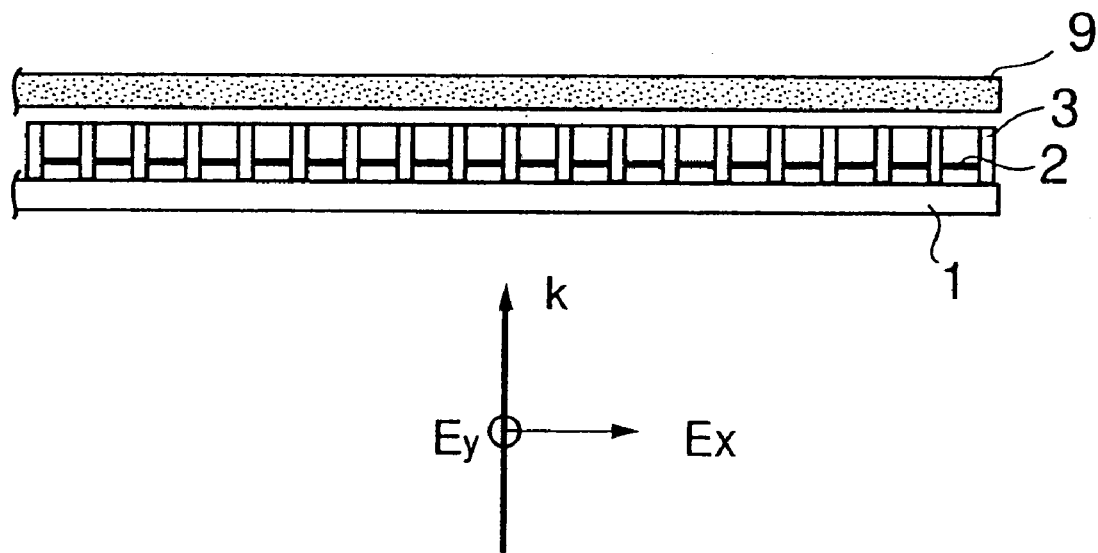
FIG. 1B is a sectional view showing the infrared photodetector in FIG. 1A.
Figure 2:
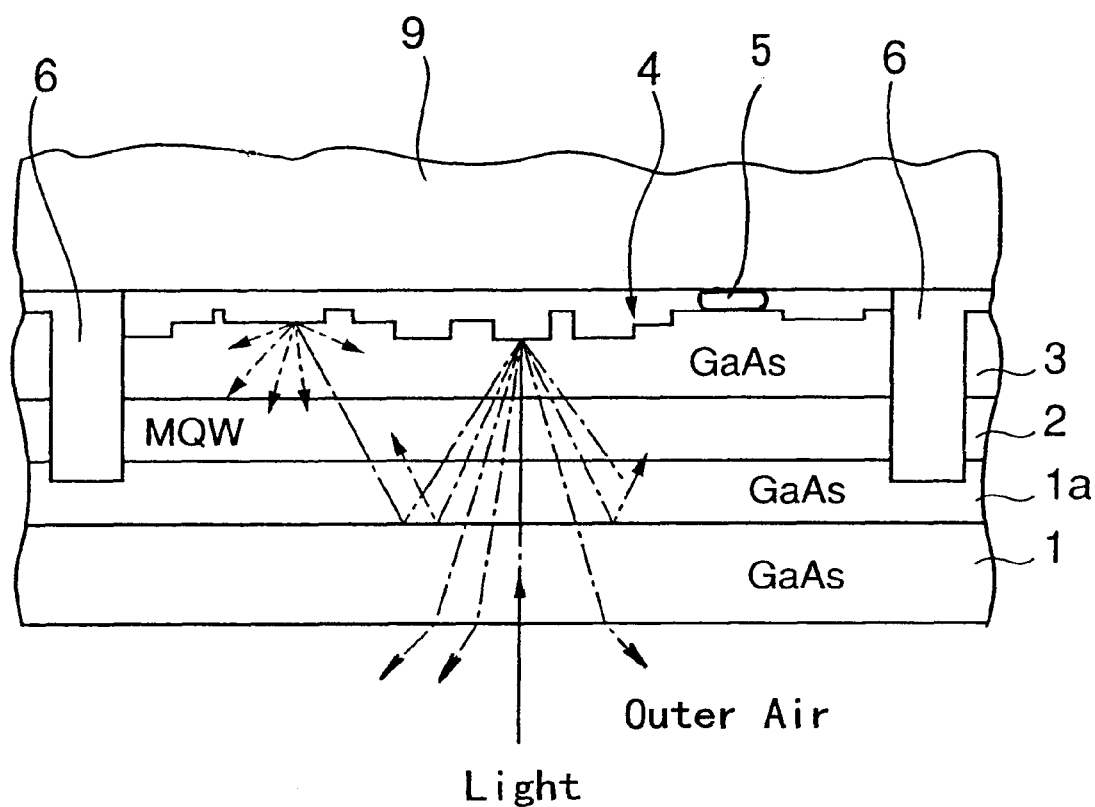
FIG. 2 is a sectional view showing a photodetector having a pseudo-random grating in the prior art.
Figure 3A:
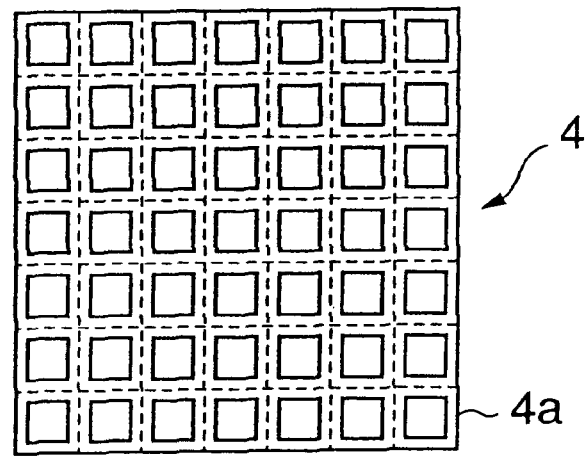
FIG. 3A is a plan view showing a two-dimensional periodic diffraction grating in the prior art.
Figure 3B:
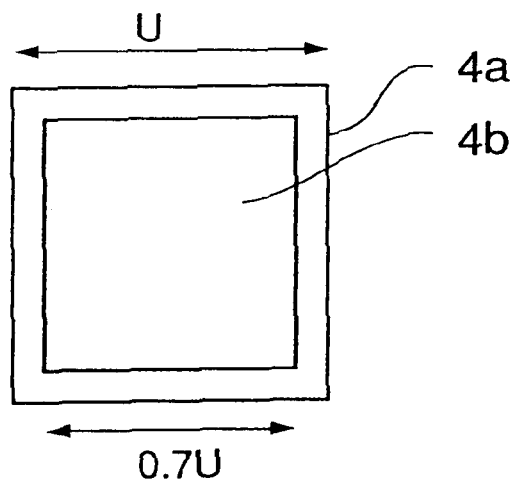
FIG. 3B is a plan view showing one pixel of the two-dimensional periodic diffraction grating in FIG. 3A.
Figure 3C:
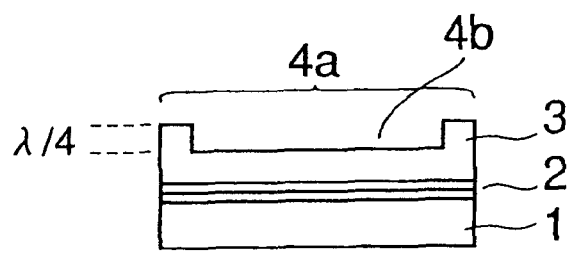
FIG. 3C is a sectional view showing one pixel of the two-dimensional periodic diffraction grating in FIG. 3A.
Figure 4A:
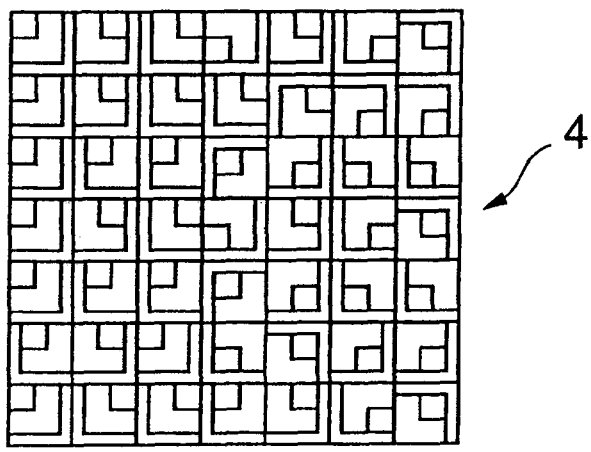
FIG. 4A is a plan view showing a pseudo-random grating in the prior art.
Figure 4B:
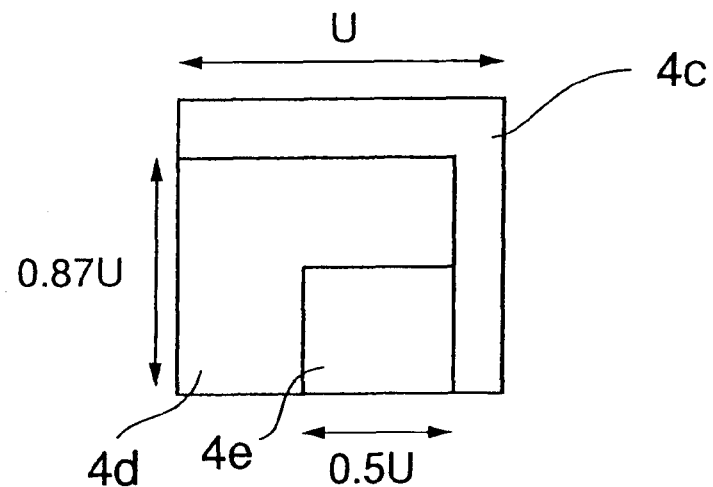
FIG. 4B is a plan view showing one pixel of the pseudo-random grating in FIG. 4A.
Figure 4C:
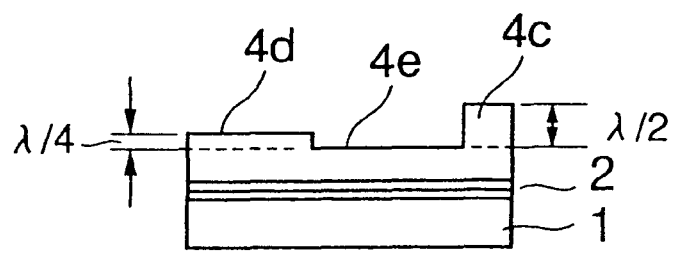
FIG. 4C is a sectional view showing one pixel of the pseudo-random grating in FIG. 4A.

As described above, since the diffraction pattern can be formed by a single photolithography step, it is easier to fabricate compared to the conventional pseudo-random grating shown in FIGS. 4A to 4C, that requires two or more steps.

In addition, since the narrowest width of the diffraction patterns according to the embodiment of the present invention can be set to about 0.6 µm, the pattern precision can be enhanced.

Then, based on the basic patterns shown in FIG. 6A constituting the diffraction pattern on the upper surface of one pixel of a light receiving element, an area to be etched and an area not to be etched are given by mathematical formulae in the following.

To begin with, assume that the longitudinal and lateral directions of the quarter elliptic pattern shown in FIG. 6A and the etching direction are set an x-axis, a y-axis, and a z-axis respectively and a co-ordinate of a point P in the etching area is set as (x, y, z). And a co-ordinate of a reference point is set as ($x_0$, $y_0$, $z_0$).

In this case, x of the point P is in the range of $x_0 < x \leq x_0 + C$ and y of the point P is in the range of $y_0 < y \leq y_0 + C$. The symbol C denotes the constant distance.

Following elements (1) to (8) represent respective etching areas depending upon differences in the quarter elliptic patterns. In the elements (1) to (8), a symbol d denotes the etching depth of the second n-type GaAs layer 14, $z = z_0 - d$ denotes the etched concave portion 14a, and $z = z_0$ denotes the non-etching area. And, $a_1$ and $b_1$ denote semi-minor and semi-major axis of the first elliptical curve respectively, and $a_2$ and $b_2$ denote semi-major and semi-minor axis of the second elliptical curve respectively.

Figure 8:
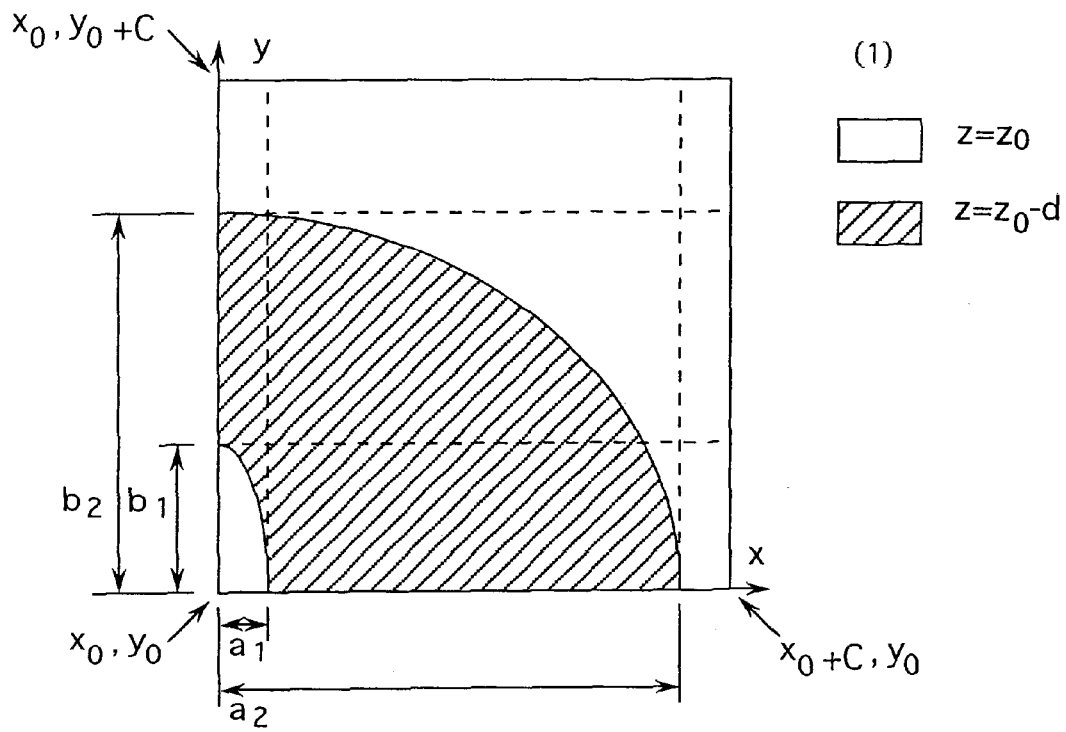
FIG. 8 is a plan view showing an etching area and a non-etching area of a first element constituting the diffraction pattern in FIG. 7A.

(1) Conditions for the etching pattern shown in FIG. 8:
① An area which is etched up to the depth of $z = z_0 - d$:

If $y_1 = y_0 + [a_1^2 b_1^2 - b_1^2 (x-x_0)^2]^{1/2} / a_1$, and $y_2 = y_0 + [a_2^2 b_2^2 - b_2^2 (x-x_0)^2]^{1/2} / a_2$, are assumed, the etching area can be given as an area which satisfies the conditions of $x_0 < x \leq x_0 + a_1$ and $y_1 < y \leq y_2$, or an area which y satisfies the conditions of $x_0 + a_1 < x \leq x_0 + a_2$ and $y_0 < y \leq y_2$, and satisfies the conditions of $y_0 \leq y_2 \leq y_0 + C$ and $y_0 \leq y_1 \leq y_0 + C$.

② An areas which is not etched:
An area except the area given in ① is not etched and thus $z = z_0$.

Figure 9:
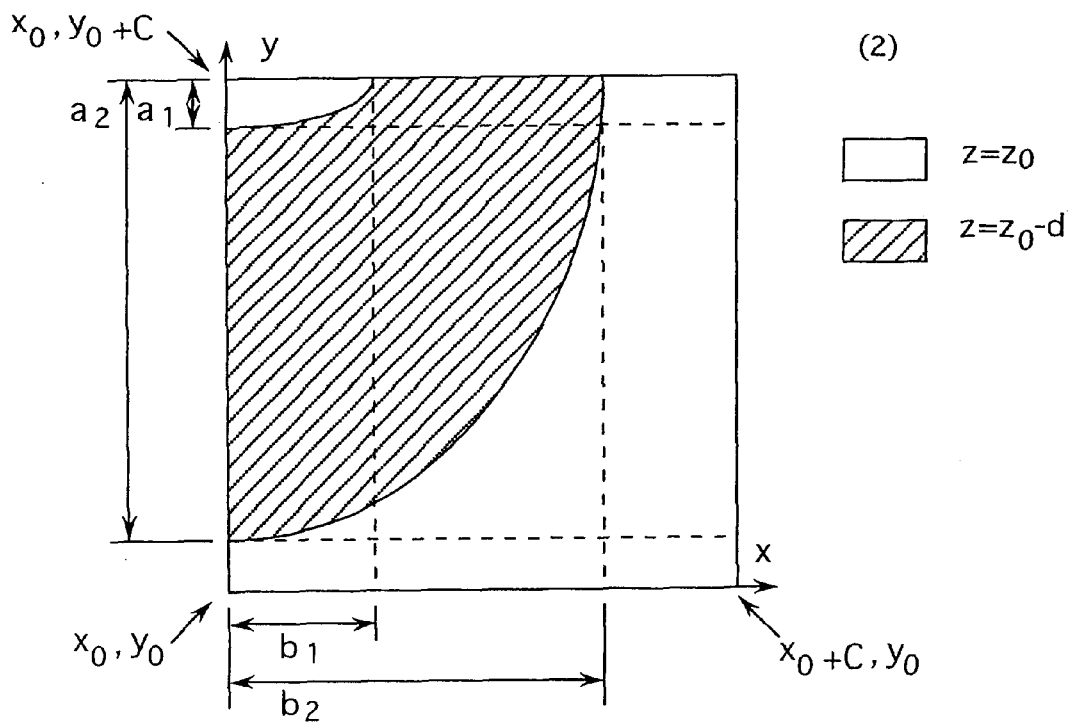
FIG. 9 is a plan view showing an etching area and a non-etching area of a second element constituting the diffraction pattern in FIG. 7A.

(2) Conditions for the etching pattern shown in FIG. 9:
① An area which is etched up to the depth of $z = z_0 - d$:

If $y_1 = (y_0 + C) + [a_1^2 b_1^2 - a_1^2 (x-x_0)^2]^{1/2} / b_1$, and $y_2 = (y_0 + C) + [a_2^2 b_2^2 - a_2^2 (x-x_0)^2]^{1/2} / b_2$, are assumed, the etching area can be given as an area which satisfies the conditions of $x_0 < x \leq x_0 + b_1$ and $y_2 < y \leq y_1$, or an area which satisfies the conditions of $x_0 + b_1 < x \leq x_0 + b_2$ and $y_2 < y \leq y_0 + C$, and satisfies the conditions of $y_0 \leq y_2 \leq y_0 + C$ and $y_0 \leq y_1 \leq y_0 + C$.

② An areas which is not etched:
An area except the area given in ① is not etched and thus $z = z_0$.

Figure 10:
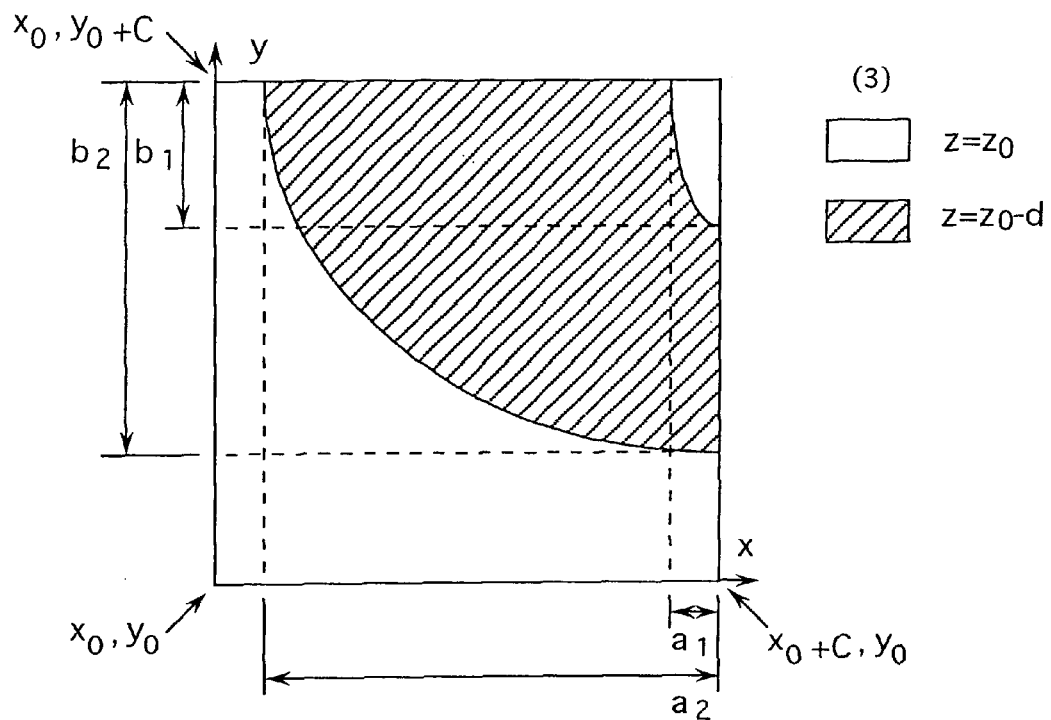
FIG. 10 is a plan view showing an etching area and a non-etching area of a third element constituting the diffraction pattern in FIG. 7A.

(3) Conditions for the etching pattern shown in FIG. 10:
① An area which is etched up to the depth of $z = z_0 - d$:

If $y_1 = (y_0 + C) + [a_1^2 b_1^2 - b_1^2 (x-C-x_0)^2]^{1/2} / a_1$, and $y_2 = (y_0 + C) + [a_2^2 b_2^2 - b_2^2 (x-C-x_0)^2]^{1/2} / a_2$, are assumed, the etching area can be given as an area which satisfies the conditions of $x_0+C-a_2<x\leq x_0+C-a_1$ and $y_2<y\leq y_0+C$, or an area which satisfies the conditions of $x_0+C-a_1<x\leq x_0+C$ and $y_2<y\leq y_1$, and satisfies the conditions of $y_0\leq y_2\leq y_0+C$ and $y_0\leq y_1\leq y_0+C$.

② An areas which is not etched:
An area except the area given in ① is not etched and thus $z=z_0$.

Figure 11:
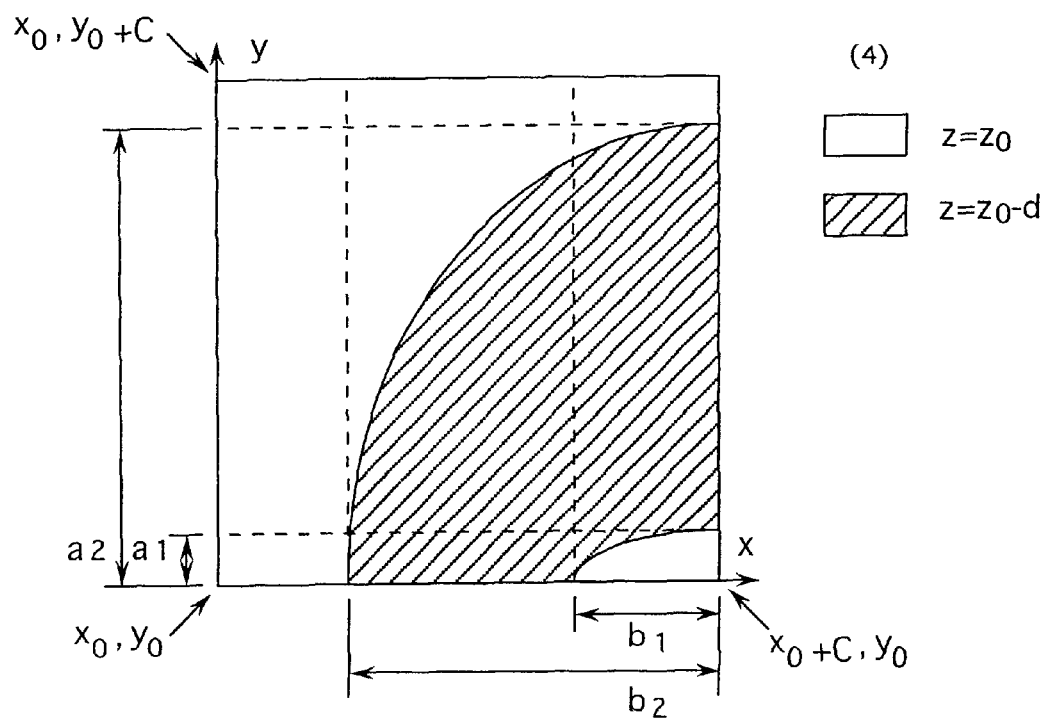
FIG. 11 is a plan view showing an etching area and a non-etching area of a fourth element constituting the diffraction pattern in FIG. 7A.

(4) Conditions for the etching pattern shown in FIG. 11:
① An area which is etched up to the depth of $z=z_0-d$:

If $y_1=y_0+[a_1^2b_1^2-a_1^2(x-C-x_0)^2]^{1/2}/b_1$, and $y_2=y_0+[a_2^2b_2^2-a_2^2(x-C-x_0)^2]^{1/2}/b_2$, are assumed, the etching are can be given as an area which satisfies the conditions of $x_0+C-b_2<x\leq x_0+C-b_1$ and $y_0<y\leq y_2$, or an area which satisfies the conditions of $x_0+C-b_1<x\leq x_0+C$ and $y_0<y\leq y_1$, and satisfies the conditions of $y_0\leq y_2\leq y_0+C$ and $y_0<y_1<y_0+C$.

② An areas which is not etched:
An area except the area given in ① is not etched and thus $z=z_0$.

Figure 12:
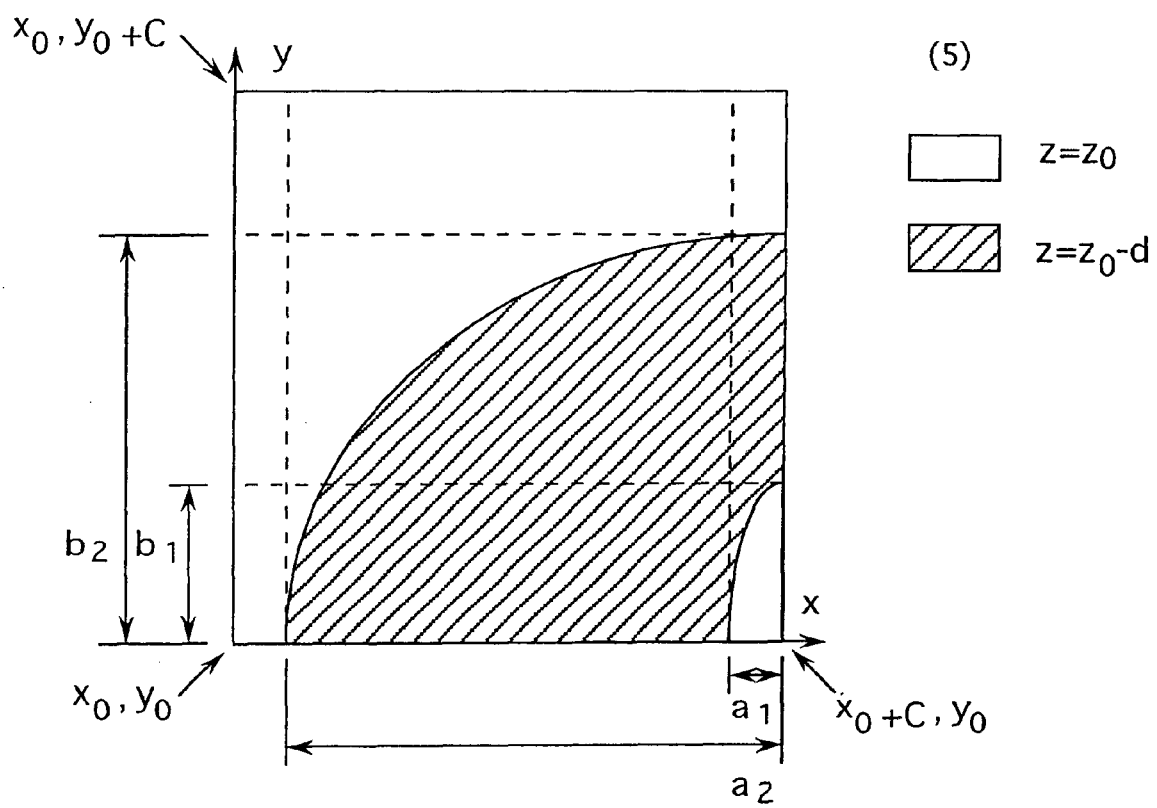
FIG. 12 is a plan view showing an etching area and a non-etching area of a fifth element constituting the diffraction pattern in FIG. 7A.

(5) Conditions for the etching pattern shown in FIG. 12:
① An area which is etched up to the depth of $z=z_0-d$:

If $y_1=y_0+[a_1^2b_1^2-b_1^2(x-C-x_0)^2]^{1/2}/a_1$, and $y_2=y_0+[a_2^2b_2^2-b_2^2(x-C-x_0)^2]^{1/2}/a_2$, are assumed, the etching area can be given as an area which satisfies the conditions of $x_0+C-a_2<x\leq x_0+C-a_1$ and $y_0<y\leq y_2$, or an area which satisfies the conditions of $x_0+C-a_1<x\leq x_0+C$ and $y_1<y\leq y_2$, and satisfies the conditions of $y_0\leq y_2\leq y_0+C$ and $y_0\leq y_1\leq y_0+C$.

② An area which is not etched:
An area except the area given in is not etched and thus $z=z_0$.

Figure 13:
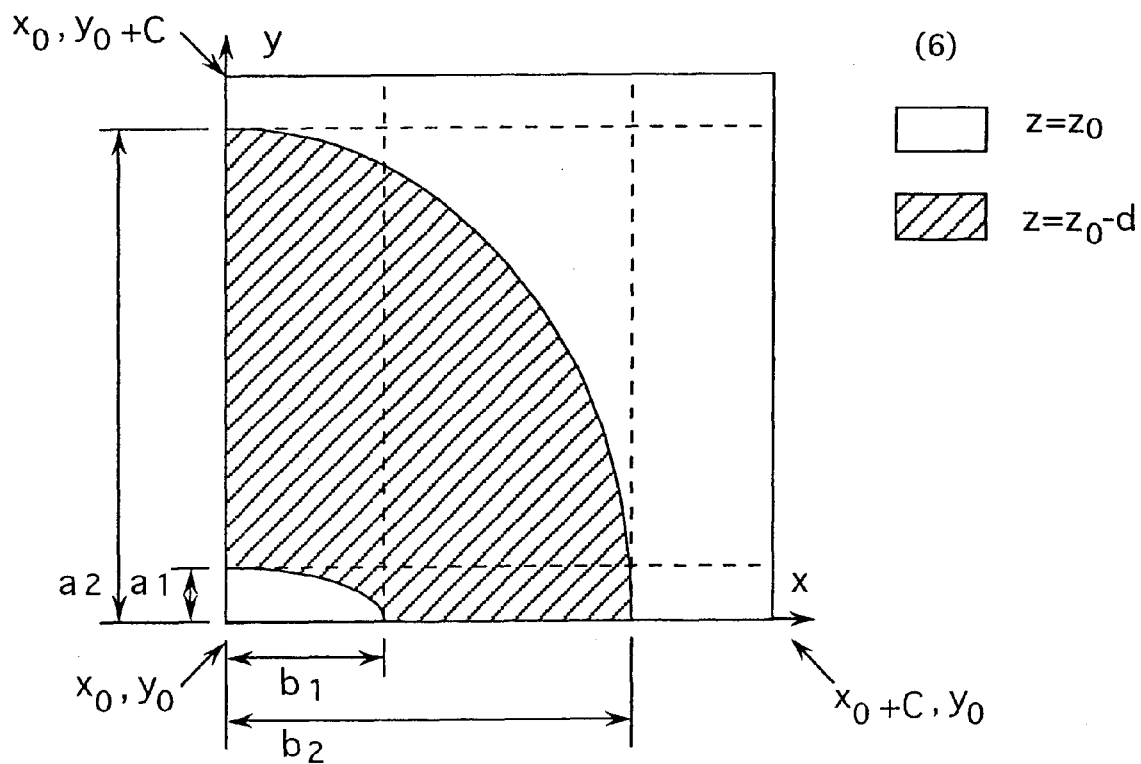
FIG. 13 is a plan view showing an etching area and a non-etching area of a sixth element constituting the diffraction pattern in FIG. 7A.

(6) Conditions for the etching pattern shown in FIG. 13:
① An area which is etched up to the depth of $z=z_0-d$:

If $y_1=y_0+[a_1^2b_1^2-a_1^2(x-x_0)^2]^{1/2}/b_1$, and $y_2=y_0+[a_2^2b_2^2-a_2^2(x-x_0)^2]^{1/2}/b_2$, are assumed, the etching area can be given as an area which satisfies the conditions of $x_0<x\leq x_0+b_1$ and $y_1<y\leq y_2$, or an area which satisfies the conditions of $x_0+b_1<x\leq x_0+b_2$ and $y_0<y\leq y_2$, and satisfies the conditions of $y_0\leq y_2\leq y_0+C$ and $y_0\leq y_1\leq y_0+C$.
are assumed, the etching area can be given as an area which satisfy the conditions of $x_0<x\leq x_0+b_1$ and $y_1<y\leq y_2$, or an area which satisfy the conditions of $x_0+b_1<x\leq x_0+b_2$ and and $y_0<y\leq y_2$, and satisfy the conditions of $y_0\leq y_2\leq y_0+C$ and $y_0\leq y_1\leq y_0+C$.

② An areas which is not etched:
An area except the area given in ① is not etched and thus $z=z_0$.

Figure 14:
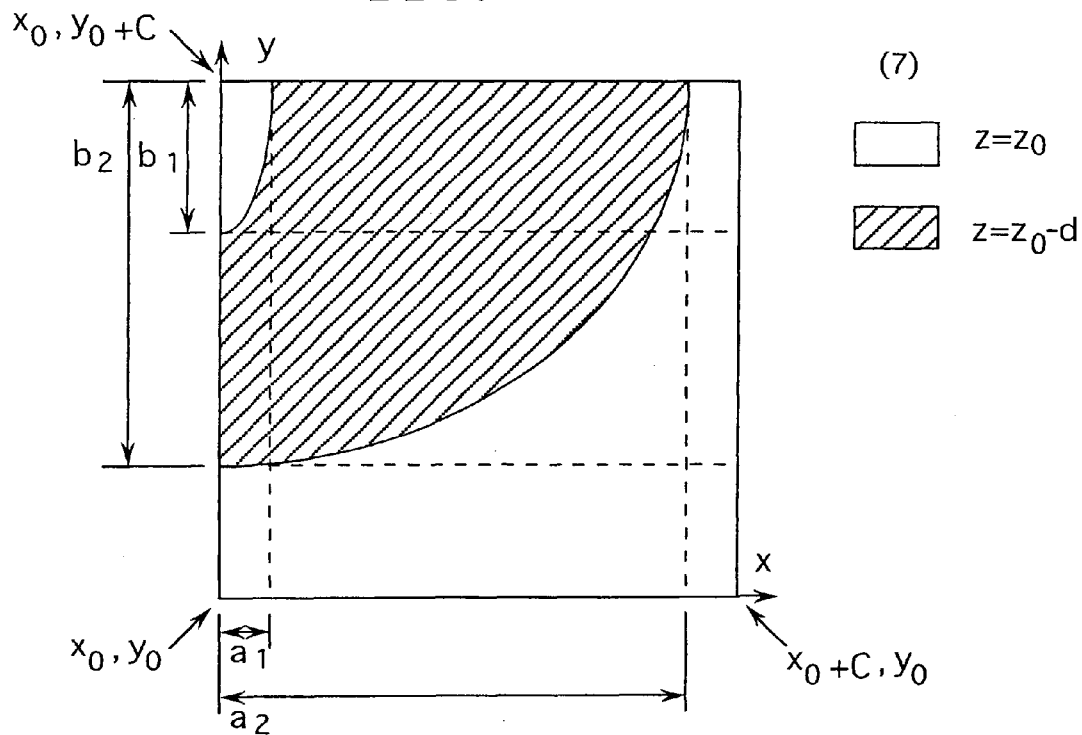
FIG. 14 is a plan view showing an etching area and a non-etching area of a seventh element constituting the diffraction pattern in FIG. 7A.

(7) Conditions for the etching pattern shown in FIG. 14:
① An area which is etched up to the depth of $z=z_0-d$:

If $y_1=(y_0+C)+[a_1^2b_1^2-b_1^2(x-x_0)^2]^{1/2}/a_1$, and $y_2=(y_0+C)+[a_2^2b_2^2-b_2^2(x-x_0)^2]^{1/2}/a_2$, are assumed, the etching area can be given as an area which satisfies the conditions of $x_0<x\leq x_0+a_1$ and $y_2<y\leq y_1$, or an area which satisfies the conditions of $x_0+a_1<x\leq x_0+a_2$ and $y_2<y\leq y_0+C$, and satisfies the conditions of $y_0\leq y_2\leq y_0+C$ and $y_0\leq y_1\leq y_0+C$.

② An area which is not etched:
An area except the area given in ① is not etched and thus $z=z_0$.

Figure 15:
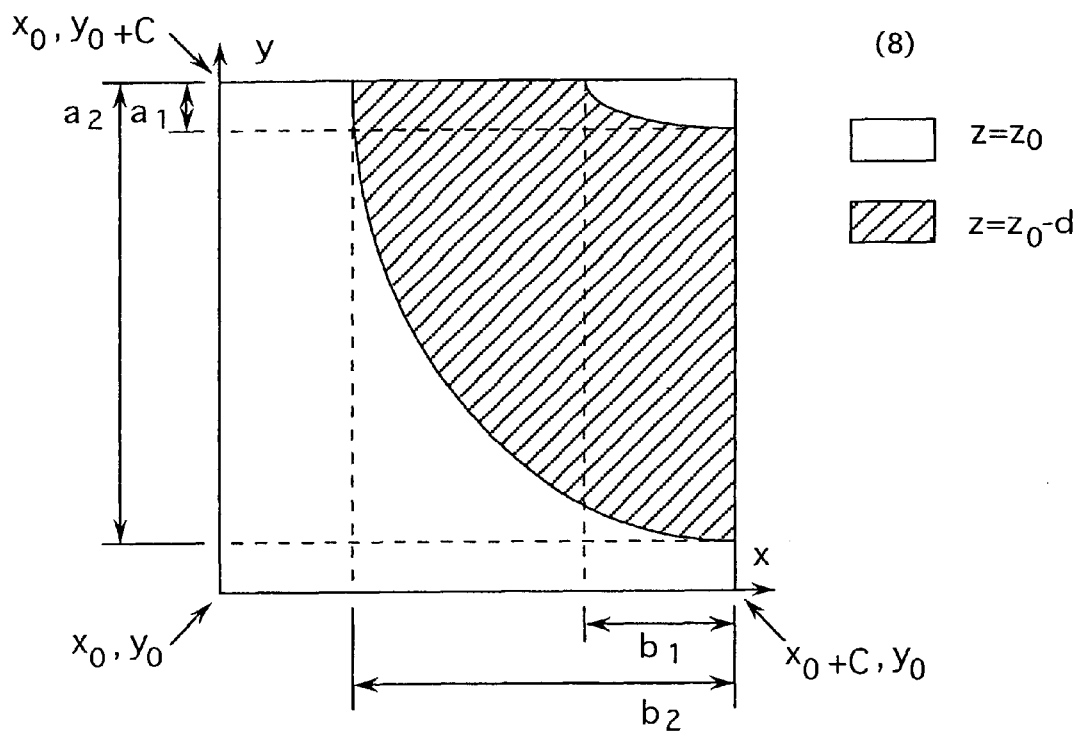
FIG. 15 is a plan view showing an etching area and a non-etching area of an eighth element constituting the diffraction pattern in FIG. 7A.

(8) Conditions for the etching pattern shown in FIG. 15:
① An area which is etched up to the depth of $z=z_0-d$:

If $y_1=(y_0+C)+[a_1^2b_1^2-a_1^2(x-C-x_0)^2]^{1/2}/b_1$, and $y_2=(y_0+C)+[a_2^2b_2^2-a_2^2(x-C-x_0)^2]^{1/2}/b_2$, are assumed, the etching area can be given as an area which satisfies the conditions of $x_0+C-b_2<x\leq x_0+C-b_1$ and $y_2<y\leq y_0$, or an area which satisfies the conditions of $x_0+C-b_1<x\leq x_0+C$ and $y_2<y\leq y_1$, and satisfies the conditions of $y_0\leq y_2\leq y_0+C$ and $y_0\leq y_2\leq y_0+C$.

② An areas which is not etched:
An area except the area given in ① is not etched and thus $z=z_0$.

In the above elements (1) to (8), $x_0$ and $y_0$ are increased stepwise like $x_0=mC$ and $y_0=nC$ respectively. Where both m and n are integral numbers.

The pattern shown in FIG. 7A can be formed by using the mathematical formulae given in the elements (1) to (8).

Figure 6B:
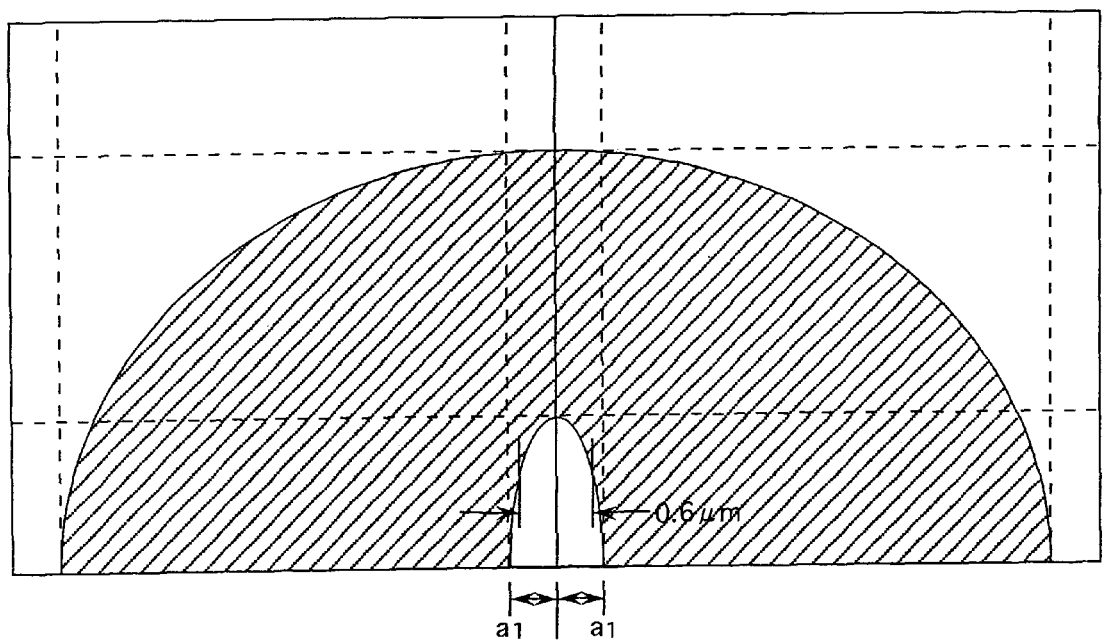
FIG. 6B is a plan view showing a pattern formed by combining two basic patterns together.

In this case, the smallest feature size in the pattern arises when two patterns of FIG. 6A come together as shown in FIG. 6B. The width of the smallest feature in this case is $2a_1$. The optimized value of $a_1$ for a wavelength of 8.5 μm is 0.4 μm as mentioned in (1) to (8). Since the feature is elliptical in shape and not rectangular, the average width is estimated to be 'w 0.6 μm' and not 0.8 μm, in FIG. 7A. For peak response wavelength 8.5 μm, the optimum value of C is 3.5 μm, and values of $a_1$, $b_1$, $a_2$ and $b_2$ are 0.4 μm, 0.9 μm, 3.0 μm, and 2.4 μm respectively, and smallest feature width is about 0.6 μm.

Figure 7B:
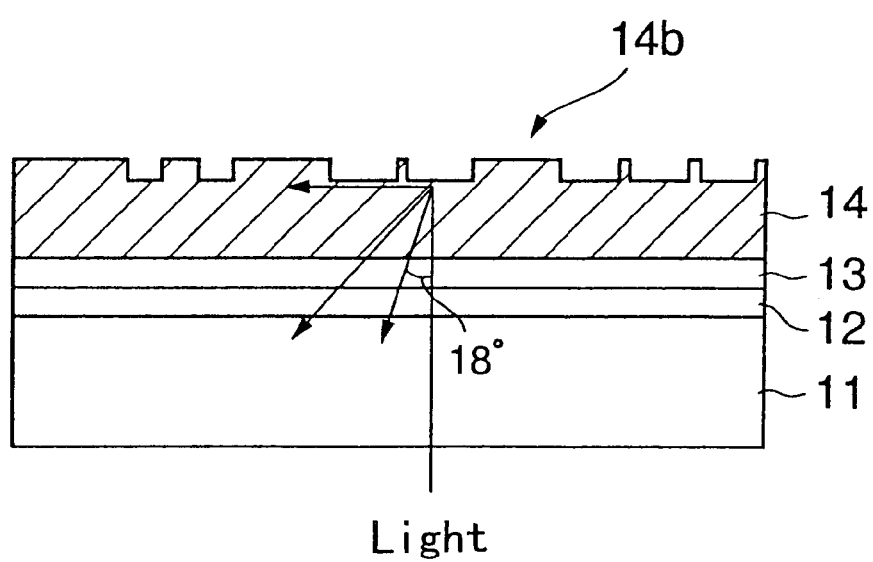
FIG. 7B is a sectional view showing the diffraction pattern taken along a I—I line in FIG. 7A.

The light being diffracted from the diffraction pattern 14b has an intensity distribution in which, for example, as shown in FIG. 7B, a component which is almost parallel with the surface of the MQW layer 13 is strong, and a component which is contained within an almost 18° angle range from the perpendicular line to the surface is weak.

Figure 16:
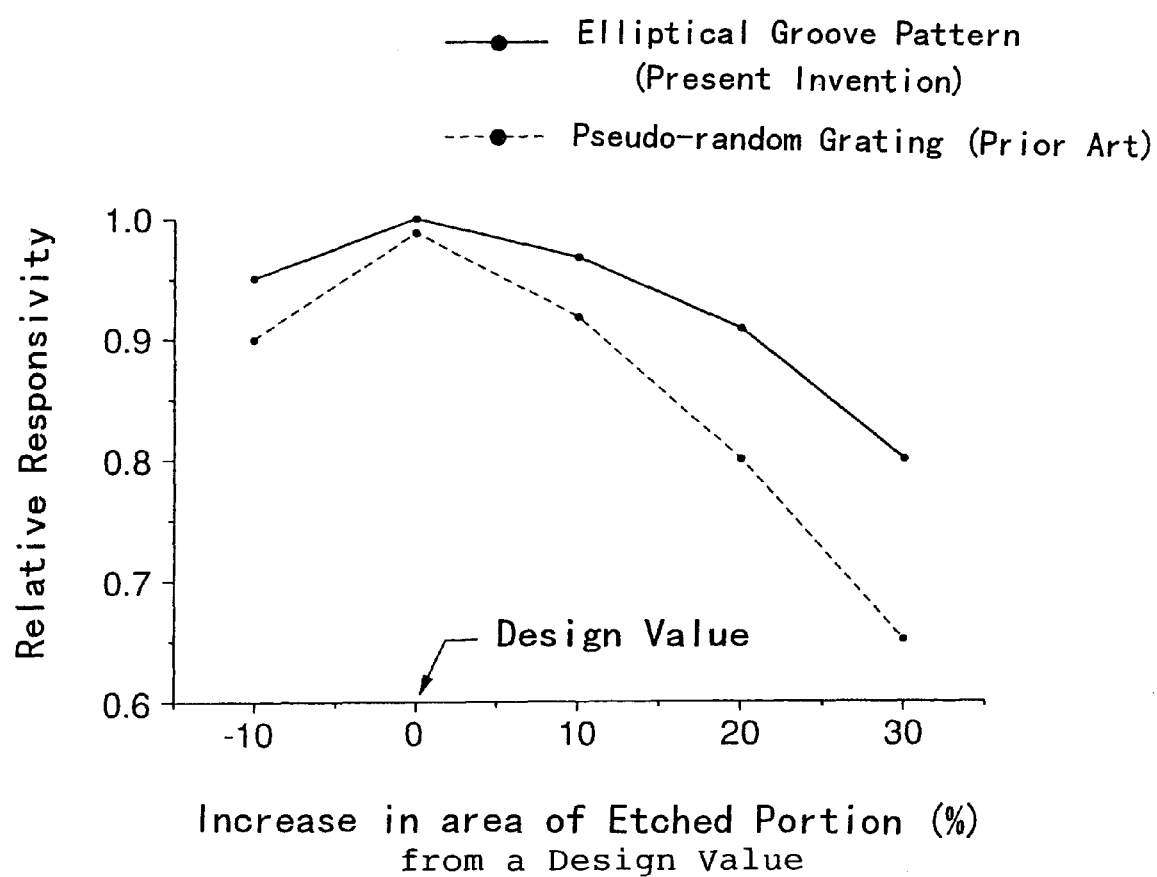
FIG. 16 is a graph showing relationships between coupling efficiencies in QWIPs according to the embodiment of the present invention and in the prior art and a discrepancy (increase or decrease) of the etching area from a design value.

A discrepancy (increase or decrease) of the etching area from a design value of the pseudo-random grating in the prior art shown in FIGS. 4A to 4C and a correlative response are plotted by a broken line in FIG. 16, and a discrepancy (increase or decrease) of the etching area from a design value of the grating having the elliptic recesses according to the embodiment of the present invention and the correlative response are plotted by a solid line in FIG. 16. It has become evident that a fabrication margin can be increased in the present invention since reduction in the response owing to the discrepancy from the design value.

FIG. 16 shows theoretical estimation of effect of fabrication errors on coupling efficiency in QWIP. In case of pseudo-random grating in prior art, the first etch has been assumed to have been fabricated without error. In the second stage, increase in area of etched portion results in lower responsivity.

Figure 17A:
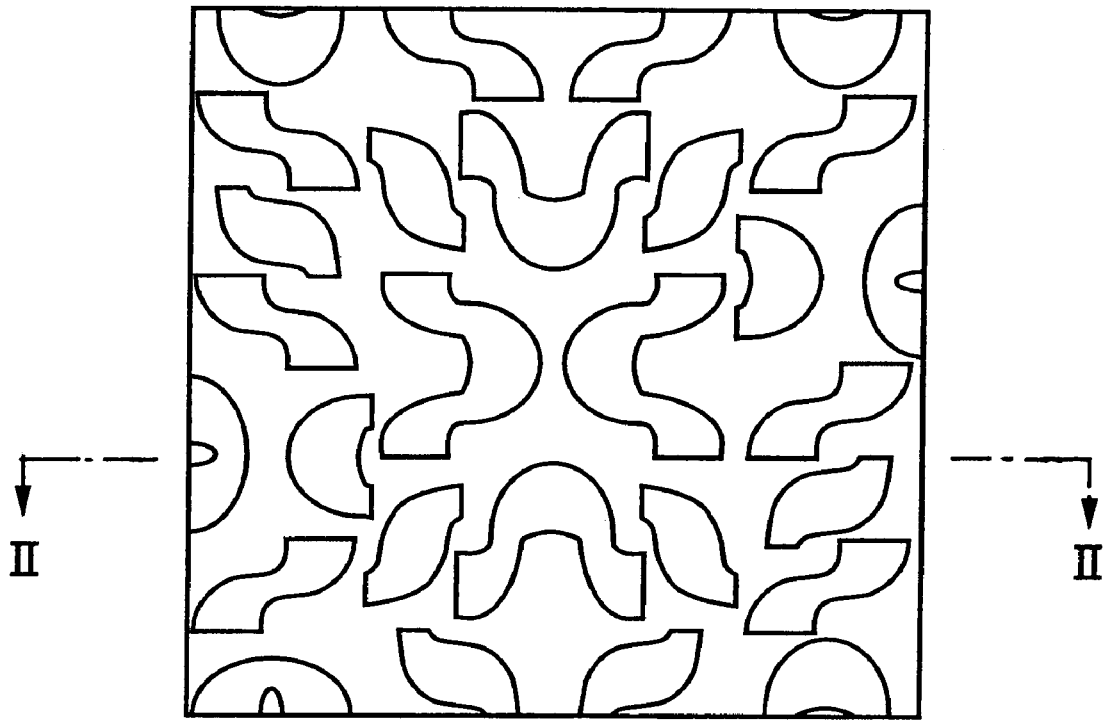
FIG. 17A is a plan view showing a second example of a diffraction pattern according to an embodiment of the present invention.
Figure 18A:
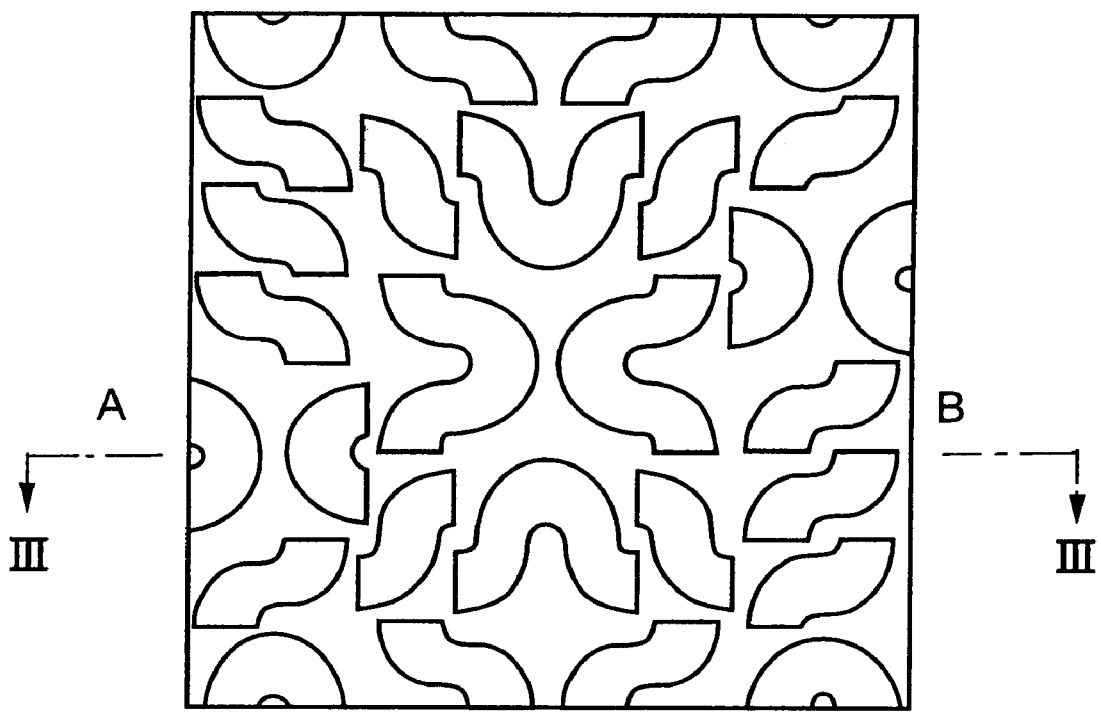
FIG. 18A is a plan view showing a third example of a diffraction pattern according to an embodiment of the present invention.

The planar shape of the recesses of the grating having an elliptic component in FIG. 7A does not contain a linear component. As shown in FIG. 17A and FIG. 18A, the recess patterns containing the linear component may be adopted.

FIG. 17A shows another example of the diffraction pattern containing the elliptic curves on a square pixel whose one side has a length of 28 μm. In this case, in the above elements (1) to (8), the length C is 3.5 μm, and $a_2$ is 3.0 μm, $b_2$=2.6 μm, $a_1$=0.4 μm, and $b_1$=0.9 μm. Then, a sectional shape of the diffraction pattern taken along a II—II line in FIG. 17A is shown in FIG. 17B.

FIG. 18A shows still another example of the diffraction pattern containing the elliptic curves on a square pixel whose one side has a length of 28 μm. In this case, in the above elements (1) to (8), the length C is 3.5 μm, and $a_2$ is 3.0 μm, $b_2$=2.8 μm, $a_1$=0.5 μm, and $b_1$=0.7 μm. Then, a sectional shape of the diffraction pattern taken along a III—III line in FIG. 18A is shown in FIG. 18B.

Figure 17B:
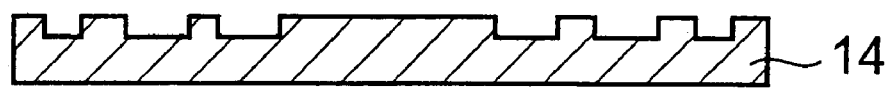
FIG. 17B is a sectional view showing the diffraction pattern taken along a II—II line in FIG. 17A.
Figure 18B:
FIG. 18B is a sectional view showing the diffraction pattern taken along a III—III line in FIG. 18A.

In the case that the radiation having the wavelength of 8.5 μm is incident onto the infrared photodetector, the diffraction pattern shown in FIGS. 17A and 17B results in about 18% higher coupling efficiency than the diffraction pattern shown in FIGS. 18A and 18B due to its ellipticity.

The photoabsorption layer is composed of the MQW layer in the above infrared photodetector, but such photoabsorption layer may be composed of quantum wires or quantum dots.

Also, the above quantum-well infrared photodetector may be employed in the infrared focal plane array (IRFPA), for example.

As described above, according to the present invention, the diffraction pattern whose planar shape has curves (e.g., elliptic curves) and whose sectional shape has the recess like a single step can be formed on the photoabsorption layer of the quantum well structure. Hence, a quantity of light absorbed in the photoabsorption layer can be increased, and also the optical coupling rate for the infrared ray having the wavelength of 8.5 μm can be enhanced.

Since the recesses constituting the diffraction pattern are formed like a single step shape, such recesses can be formed by the single lithography step and the manufacturing steps can be reduced. In addition, since the minimum width of the diffraction pattern is about 0.6 μm, the pattern can be very accurate, and the pattern fabrication is easier.

The main effect of the proposed coupling in the present invention scheme is that it results in absorption efficiency higher than the pseudo-random grating used in prior art, while simplifying the lithographic fabrication process. The fabrication is simplified because the smallest feature width is larger and the diffraction pattern requires only one etching step. Smallest feature width in case of pseudo-random grating was 0.4 μm while that in case of elliptical groove pattern, it is 0.6 μm.

Errors in lithographic fabrication of the diffraction pattern result in lowering of coupling efficiency as shown in FIG. 16. However, fabrication errors cause less reduction in coupling efficiency in case of diffraction pattern proposed in the present invention than the pseudo-random grating in the prior art.

What is claimed is:

1. An infrared photodetector comprising:

a photoabsorption layer formed on a substrate, said photoabsorption layer having a multiquantum-well structure; and a diffraction pattern formed on the photoabsorption layer to have recesses planar shape of each of which contains curved shapes and sectional shape of each of which has a single step shape, wherein the diffraction pattern is in contact with a reflecting film to constitute an integral member, and incident light is introduced from outside of the substrate and passes through the substrate and the photoabsorption layer to the reflecting film in a direction perpendicular to a surface of the photoabsorption layer.

2. An infrared photodetector according to claim 1, wherein each of the recesses has a single step shape from an uppermost surface of the diffraction pattern.

3. An infrared photodetector according to claim 1, wherein the diffraction pattern diffracts light passed from a substrate side through the photoabsorption layer, and provides a light intensity distribution which is strong at an angle which is almost parallel with a surface of the photoabsorption layer and is weak at an angle which is contained within a substantially 18° angle range from a perpendicular line to the surface of the photoabsorption layer.

4. An infrared photodetector according to claim 1, wherein each of the curved shapes is a part of an elliptic curve.

5. An infrared photodetector according to claim 1, wherein each of the recesses constituting the diffraction pattern has a depth not larger than a half of an absorption wavelength of the photoabsorption layer.

6. An infrared photodetector according to claim 1, wherein an area of the diffraction pattern in which the recesses are formed is set equal to an area of the diffraction pattern in which the recesses are not formed.

7. An infrared photodetector according to claim 1, wherein the photoabsorption layer has a structure consisting of any one of a multiquantum-well layer, a quantum wire, and a quantum box.

8. An infrared photodetector according to claim 7, wherein multiquantum-well layer is formed of compound semiconductor layers.

9. An infrared photodetector according to claim 8, wherein the compound semiconductor layers have a structure in which GaAs and AlGaAs are grown alternatively as a plurality of layers.

10. A method of manufacturing an infrared photodetector comprising the steps of:

forming a photoabsorption layer having a multiquantum-well structure on a substrate;

forming a light transmitting layer on the photoabsorption layer;

forming a mask, on which patterns having curved shapes are formed, on the light transmitting layer;

forming a diffraction pattern on the light transmitting layer by etching the light transmitting layer in areas which are not covered with the mask;

forming a reflection film in contact with the diffraction pattern such that light can be introduced from outside of the substrate so as to pass through the substrate and the photoabsorption layer to the reflection film in a direction perpendicular to a surface of the photoabsorption layer; and removing the mask.

11. A method of manufacturing an infrared photodetector according to claim 10, wherein the diffraction pattern is formed of a recess having a single step.

* * * * *